US007728396B2

(12) United States Patent
Wu et al.

(10) Patent No.: US 7,728,396 B2
(45) Date of Patent: Jun. 1, 2010

(54) SEMICONDUCTOR STRUCTURES

(75) Inventors: Hua-Shu Wu, Hsinchu (TW);
Tsung-Mu Lai, Chu-Pei (TW);
Ming-Chih Chang, Pingtung County
(TW); Che-Rong Laing, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 385 days.

(21) Appl. No.: 11/684,241

(22) Filed: Mar. 9, 2007

(65) Prior Publication Data
US 2007/0145366 A1 Jun. 28, 2007

Related U.S. Application Data

(62) Division of application No. 11/019,693, filed on Dec. 21, 2004, now Pat. No. 7,198,975.

(51) Int. Cl.
*H01L 41/113* (2006.01)
(52) U.S. Cl. .............................. 257/415; 257/E29.325
(58) Field of Classification Search ................. 257/415, 257/620, E29.325
See application file for complete search history.

(56) References Cited
U.S. PATENT DOCUMENTS

| 5,043,043 | A | 8/1991 | Howe et al. |
| 5,252,881 | A | 10/1993 | Muller et al. |
| 5,459,602 | A | 10/1995 | Sampsell |
| 5,510,299 | A | 4/1996 | Li et al. |
| 5,600,190 | A | 2/1997 | Zettler |
| 5,660,680 | A | 8/1997 | Keller |
| 5,668,062 | A | 9/1997 | Hyun et al. |
| 6,150,186 | A | 11/2000 | Chen et al. |
| 6,337,027 | B1 | 1/2002 | Humphrey |
| 6,930,367 | B2 * | 8/2005 | Lutz et al. .................. 257/417 |
| 2004/0094815 | A1 * | 5/2004 | Park et al. .................. 257/419 |

OTHER PUBLICATIONS

Taiwan Patent Application No. 094143570 Filed Dec. 9, 2005. TW Search Report dated Aug. 17, 2007.
Taiwan Patent Application No. 094143570 Filed Dec. 9, 2005. TW Written Opinion dated May 22, 2007.

* cited by examiner

*Primary Examiner*—Allan R. Wilson
(74) *Attorney, Agent, or Firm*—Duane Morris LLP

(57) ABSTRACT

A method and a structure are provided for preventing lift-off of a semiconductor monitor pattern from a substrate. A semiconductor structure and a semiconductor monitor structure are formed on a substrate. A material layer is formed covering the semiconductor monitor structure. A part of the semiconductor structure is removed without removing the semiconductor monitor structure, by using the material layer as an etch protection layer. A mask for the method is also provided. The mask includes a clear area and a dark area. The dark area prevents a semiconductor monitor structure from being subjected to exposure so as to form a material layer covering the semiconductor monitor structure and prevent removal of the semiconductor monitor structure from the substrate while a part of a semiconductor structure is removed.

20 Claims, 7 Drawing Sheets

SEMICONDUCTOR STRUCTURES

RELATED APPLICATION

This application is a divisional application of Ser. No. 11/019,693 filed Dec. 21, 2004, the contents of which are hereby incorporated by reference, as if set forth in their entirety and upon which priority is claimed.

BACKGROUND OF THE INVENTION

1. Field of the Invention

The present invention relates to the fabrication of integrated circuit devices on semiconductor substrates and, more particularly relates to monitor structures on the substrates.

2. Description of the Related Art

The manufacture of large scale integrated circuits in a mass production facility involves hundreds of discrete processing steps beginning with the introduction of blank semiconductor wafers at one end and recovering the completed chips at the other. The manufacturing process is usually viewed as consisting of the segment wherein the semiconductor devices are formed within the silicon surface (front-end-of-line) and the portion which includes the formation of the various layers of interconnection metallurgy above the silicon surface (back-end-of-line). Most of these processing steps involve depositing layers of material, patterning them by photolithographic techniques, and etching away the unwanted portions. The materials consist primarily of insulators and metal alloys. In some instances the patterned layers serve as temporary protective masks. In others they are the functional components of the integrated circuit chip.

While most development has been directed towards the manufacture of semiconductor based electronic circuits, there has recently been considerable interest in integrating electro-mechanical devices such as electric motors, springs cantilevered devices, and mechanical switches and oscillators within these electronic circuits. The repertoire of material along with a variety of available deposition and selective etching methods which have been developed in the integrated circuit industry along with a refined patterning technology have made possible the manufacture of tiny mechanical devices with movable elements. A movable element, for example the rotor of an electric motor, is patterned of material deposited onto a sacrificial layer, within a stator element. The sacrificial layer is then removed by selective isotropic etching which undercuts the rotor, freeing it from the substrate. Cantilevered devices such as mechanical switches, tuning forks or other oscillators, and leaf springs are similarly formed partially over a sacrificial layer, with an anchored portion connected to a subjacent structure.

In order to monitor the integrated circuit manufacturing process, test structures, representative of the circuit elements are typically incorporated in regions of the wafer outside the integrated circuit chips. Examples of these inline test devices include a dumb-bell structure testable with a four point probe to establish proper resistance of a deposited layer, or long serpentine metal lines which can be tested to establish the presence of particulate defects by testing for electrical opens and shorts. These devices are often designed much larger than their corresponding elements in the integrated circuit so they can be tested at various stages during processing.

Typically, these test devices are formed in the saw kerf which separates the circuit chips. In some instances, the test devices are formed in a designated chip site, referred to as a test site. However, this is usually avoided because it utilizes valuable product chip real estate.

In a product, which has micro electro-mechanical systems (MEMS), it is also desirable to have representative test structures to perform timely in-line testing of these devices as well. A problem with forming electro-mechanical test structures in the wafer kerf, or even in test sites, is that considerable particulate debris can be generated by the fracturing of free standing or lightly attached elements of these test structures. The expression "lightly attached" is used herein to indicate a structural element, for example, a long cantilever with a relatively small region of attachment to the substrate, thereby rendering it easily broken off. It is therefore desirable to have test structures for electro-mechanical devices which are designed to provide useful in-line testing but not having free standing or even lightly attached elements like their circuit counterparts.

FIG. 1 is a schematic cross sectional view showing a prior art MEMS device. The MEMS device comprises a central bearing 124a, a rotor 120b and a stator 120a in the semiconductor structure area 115 of the substrate 110. It also comprises a monitor pattern 124b in the semiconductor monitor structure area 118. The polysilicon plate 16 serves as an electric shield. Before forming the pattern in FIG. 1, a relieving process is used to remove sacrificial layers (not shown) in the semiconductor structure and the semiconductor monitor structure. The relieving process usually is a wet etch process and may lift off the semiconductor monitor structure 124b if the semiconductor monitor structure 124b is not well anchored to the substrate 110. The lift-off of the semiconductor monitor structure 124b results in a particle issue that reduces the yield of the MEMS devices. In order to resolve the particle issue, the semiconductor monitor structure 124b should be well anchored to the substrate 110 by increasing the contact area between the semiconductor monitor structure 124b and the substrate 110. But when the semiconductor monitor structure 124b becomes complicated, the design of maintaining the contact area between the monitor structure 124b and the substrate 110 also becomes complicated. Such a design has increased inconvenience for fabricating the MEMS devices.

Further, process monitors in the saw kerf of the wafer, with non-anchored or lightly attached mechanical elements, would release significant (or more than normal) debris during wafer dicing. U.S. Pat. No. 5,668,062 shows that when integrated circuit chips contain mechanical devices, in this instance mechanical mirrors, that the chips cannot be protectively coated during wafer dicing. Steps must be taken to eliminate metal fragments in the saw debris and which would otherwise lodge under the movable mirrors. The solution taught by the reference involves defining scribe line extensions of the array scribe lines to the edge of the wafer, whereby the scribe line extensions as well as the array scribe lines are free of the metal which is used to form the mirrors. While the procedure is very narrow in scope, the reference nevertheless shows that a specific type of debris (aluminum flakes during the dicing operation) compromises the proper function of MEMS devices.

U.S. Pat. No. 6,337,027 B1 teaches the formation of MEMS devices which are formed from in an epitaxial layer on a sacrificial silicon substrate. The devices, still on the substrate, are then bonded onto pedestals on a glass substrate. The sacrificial silicon substrate is then removed by spray etching, leaving the individual devices mounted on the supporting pedestals. The reference includes several methods of encapsulation of the complete MEMS devices before the substrate is diced using laser scribing.

U.S. Pat. No. 6,150,186 teaches the coating of a metal wire spring bonded to a silicon substrate to form a more resilient spring. The coating method improves the mechanical properties of the spring. The coating method may also be used to improve the resiliency of other spring devices such as a cantilevered spring.

U.S. Pat. No. 5,660,680 cites procedures for forming various useful micro structures such as tubes and beams as well as micro sensing and actuating devices by the use of patterned sacrificial molds in which the devices are formed and thereafter released by etching away the mold.

SUMMARY OF THE INVENTION

A method for preventing removal of a semiconductor monitor pattern from a substrate includes forming a semiconductor structure and a semiconductor monitor structure on a substrate. A material layer is formed covering the semiconductor monitor structure. A part of the semiconductor structure is removed without removing the semiconductor monitor structure by using the material layer as an etch protection layer.

A structure comprises semiconductor monitor structure having a first sacrificial layer and a structural layer contacting to each other. A material layer covers the first sacrificial layer and the structural layer so as to prevent removal of the first sacrificial layer from a substrate while a second sacrificial layer of a semiconductor structure is removed from the same substrate.

The above and other features of the present invention will be better understood from the following detailed description of the preferred embodiments of the invention that is provided in connection with the accompanying drawings.

DESCRIPTION OF THE PREFERRED EMBODIMENT

FIGS. 2A-2F are cross sectional views showing a process of forming a micro electormechanical system (MEMS) device.

Figure 1:
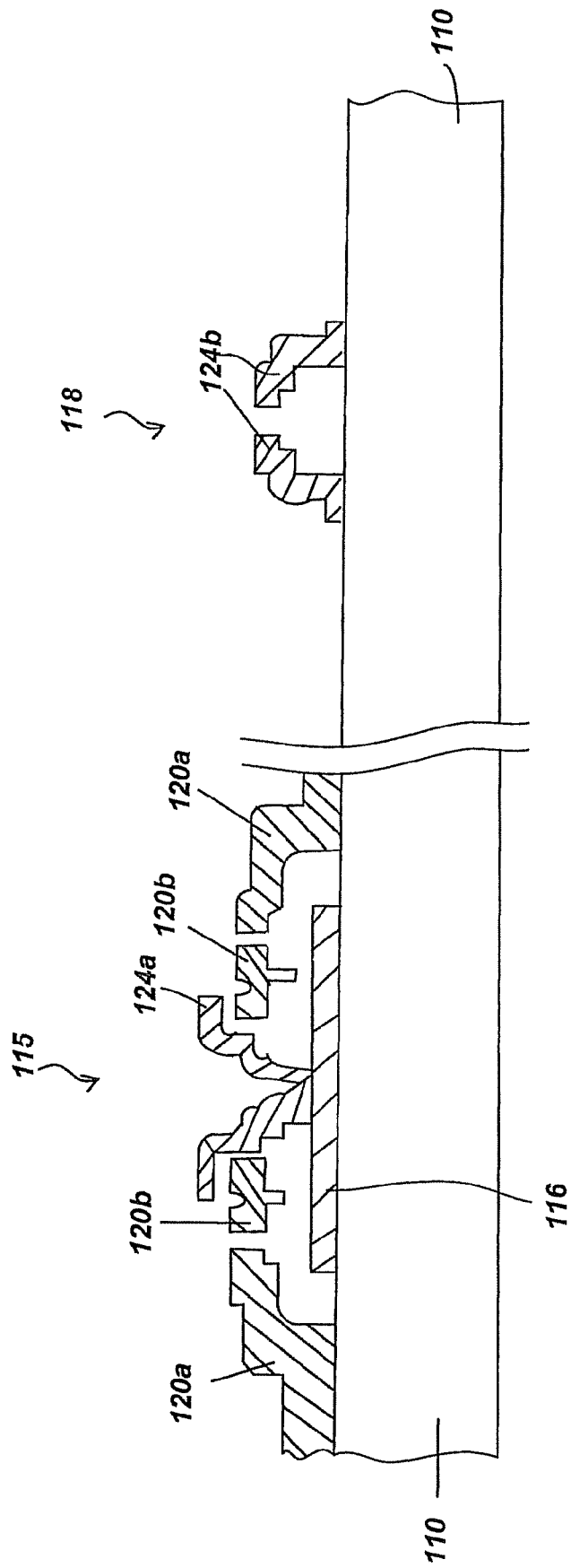
FIG. 1 is a schematic cross sectional view showing a prior art MEMS device.
Figure 2A:
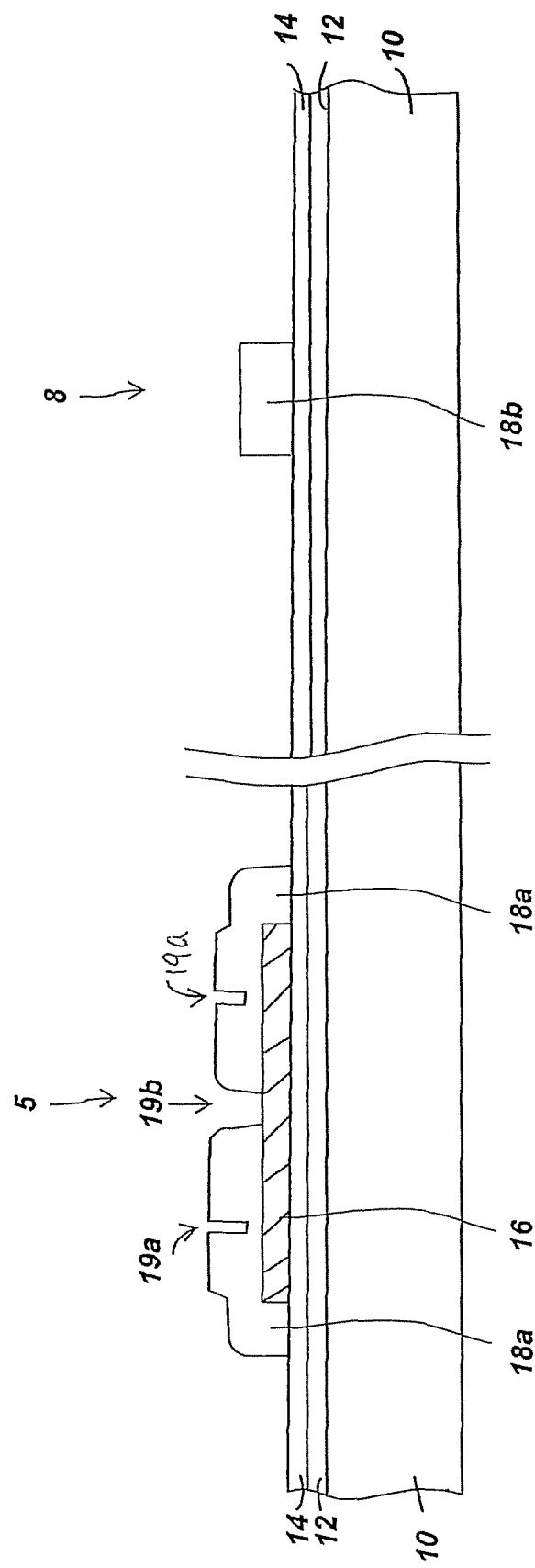
FIGS. 2A-2F are cross sectional views showing a process of forming a micro electormechanical system (MEMS) device.

Referring to FIG. 2A, a substrate 10 comprises a semiconductor structure area 5 and a semiconductor monitor structure area 8. The semiconductor structure area 5 is adapted to have a semiconductor structure, such as a transistor (not shown), formed thereon, and the semiconductor monitor structure area 8 is adapted to have a semiconductor monitor structure (shown in FIG. 2E) formed thereon.

A pad layer 12 is formed on the substrate 10. A base layer 14 is formed on the pad layer 12. A polysilicon plate 16 is formed on the base layer 14. A first sacrificial layer, including portions 18a and 18b, is formed on the base layer 14. Portion 18a of the first sacrificial layer covers a part of the polysilicon plate 16. Portion 18b of the first sacrificial layer is also formed on the base layer 14 in the semiconductor monitor structure area 8.

The substrate 10 may also comprise shallow trench isolation (STI) structures (not shown) and gate structures (not shown) formed thereon. The pad layer 12 can be a material such as silicon oxide, silicon nitride or silicon oxy-nitride and be formed by Chemical Vapor Deposition (CVD) or thermal oxidation. In some embodiments, the pad layer 12 is a pad oxide with a thickness from about 10 nm to about 100 nm. The base layer 14 can be a material such as silicon nitride or silicon oxy-nitride and can be formed, for example, by CVD. In this embodiment, the semiconductor structure to be formed in the semiconductor structure area 5 comprises a micro electric motor having a fixed stator 20a (FIG. 2E) and a free floating rotor 20b (FIG. 2E). The rotor 20b is a circular free floating element which operates within a circular opening in the stator 20a. The polysilicon plate 16 can be formed, for example, by CVD. The pattern of the polysilicon plate 16 can be formed by forming a polysilicon layer (not shown) on the base layer 14 and patterning the polysilicon layer by a photolithographic process and an etch process. The polysilicon plate 16 serves as an electric shield as well as a hard bearing surface upon which the to-be-formed rotor will operate.

A first sacrificial material (not shown) is then formed over the substrate 10, covering the base layer 14 and the polysilicon layer 16. The first sacrificial material can be material such as silicon oxide, silicon nitride, silicon oxy-nitride or another material which has an etch removal rate with respect to an etch process different from that of the polysilicon layer 16 and the base layer 14. After reading the descriptions of this embodiment, one of ordinary skill in the art will understand how to select the materials of the base layer 14 and the first sacrificial material. The first sacrificial material is substantially conformal over the structure comprising the base layer 14 and the polysilicon layer 16. In some embodiments, the first sacrificial material is silicon oxide. A photolithographic process and an etch process then pattern the first sacrificial material so as to form the first sacrificial layer portions 18a and 18b in the semiconductor structure area 5 and the semiconductor monitor structure area 8, respectively. Openings 19a and 19b are also formed in the first sacrificial layer portion 18a. The openings 19a are etched in the first sacrificial layer portions 18a to fashion bushings 20bb on the rotor (20b in FIG. 2B) which will ride on the polysilicon plate 16. The openings 19a are etched nearly, but not all the way, through to the polysilicon plate 16 so that when the first sacrificial layer 18a is etched out, the rotor bushing 20bb will be free floating. The center opening 19b is etched through to the polysilicon plate 16 to form the bottom section of a mold in which a fixed central bearing 24a (FIG. 2D) of the rotor 20b will be formed. The central bearing 24a (shown in FIG. 2E) will be anchored to the polysilicon plate 16 at the base layer 14 of the opening 19b and will become the axis of rotation of the rotor 20b. The central bearing 24a will also retain the rotor 20b within its region of operation. In the semiconductor monitor structure area 8, the first sacrificial layer portion 18b becomes an element of the semiconductor monitor structure.

In some embodiments, the first sacrificial layer portions 18a and 18b are formed by different processes which form and pattern different structural materials so as to form the first sacrificial layer portions 18a and 18b. One of ordinary skill in the art will understand that forming the first sacrificial layer portions 18a and 18b of the same material in the same process can simplify the manufacturing of the MEMS device.

Figure 2B:
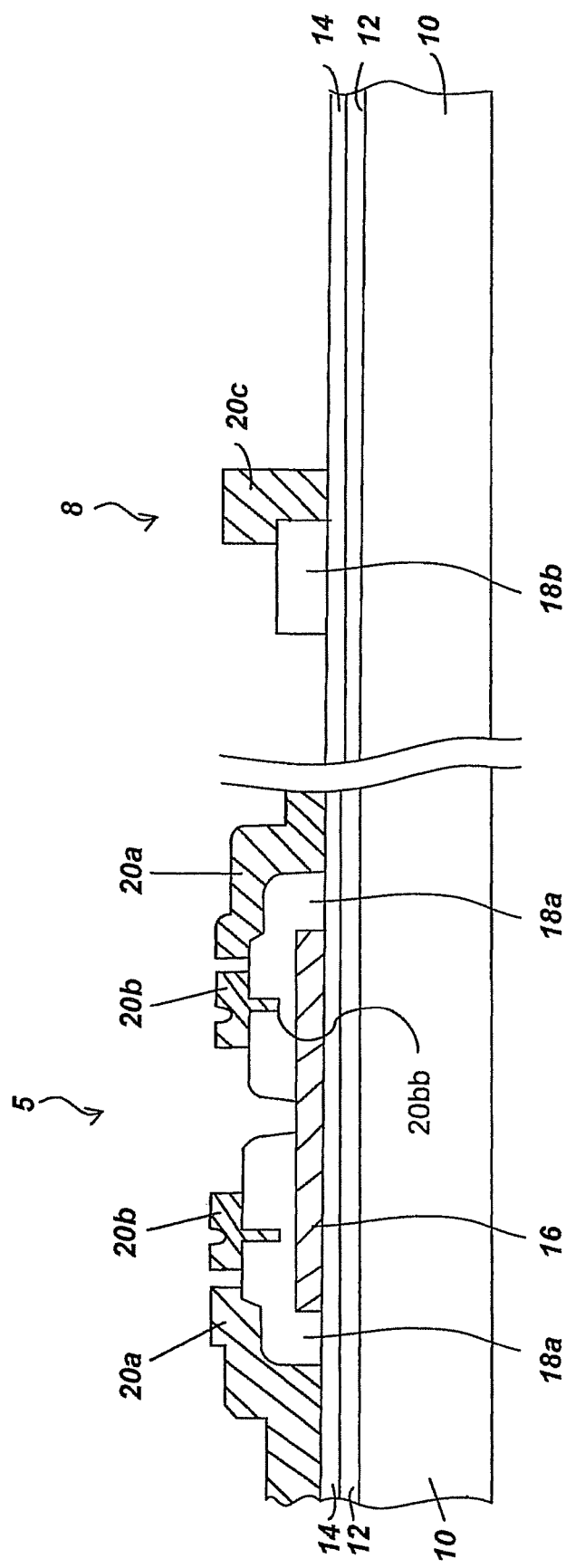

Referring to FIG. 2B, first structural layer portions 20a and 20b, and 20c are formed in the semiconductor structure area 5 and the semiconductor monitor structure area 8, respectively. The term "structural layers" refers to layers that are not sacrificial layers. The first structural layer portions 20a and 20b can be a material such as silicon and can be formed, for example, by CVD. In some embodiments, the first structural layer portions 20a and 20b are doped polysilicon. The pattern of the first structural layer portions 20a and 20b can be formed, for example, by forming a first structural material (not shown) over the structure in FIG. 2A. A photolithographic process and an etch process pattern the first structural material so as to form the first structural layer portions 20*a* and 20*b*. The portions 20*a* and 20*b* of the first structural layer in the semiconductor structure area 5 serves as a stator and a rotor, respectively. The portion 20*c* of the first structural layer in the semiconductor monitor structure area 8 becomes another element of the semiconductor monitor structure. The portion 20*c* of the first structural layer is patterned in such a fashion, to be a monitor structure representative of the rotor 20*b* and stator 20*a* in the semiconductor structure area 5, which contacts the portion 18*b* of the first sacrificial layer. In some embodiments, the first structural layer portions 20*a* and 20*b* are formed by different processes which form and pattern different structural materials so as to form the first structural layer portions 20*a* and 20*b*. One of ordinary skill in the art will understand that forming the portions 20*a* and 20*b* of the first structural layers in the same process can simplify the manufacturing of the MEMS device.

Figure 2C:
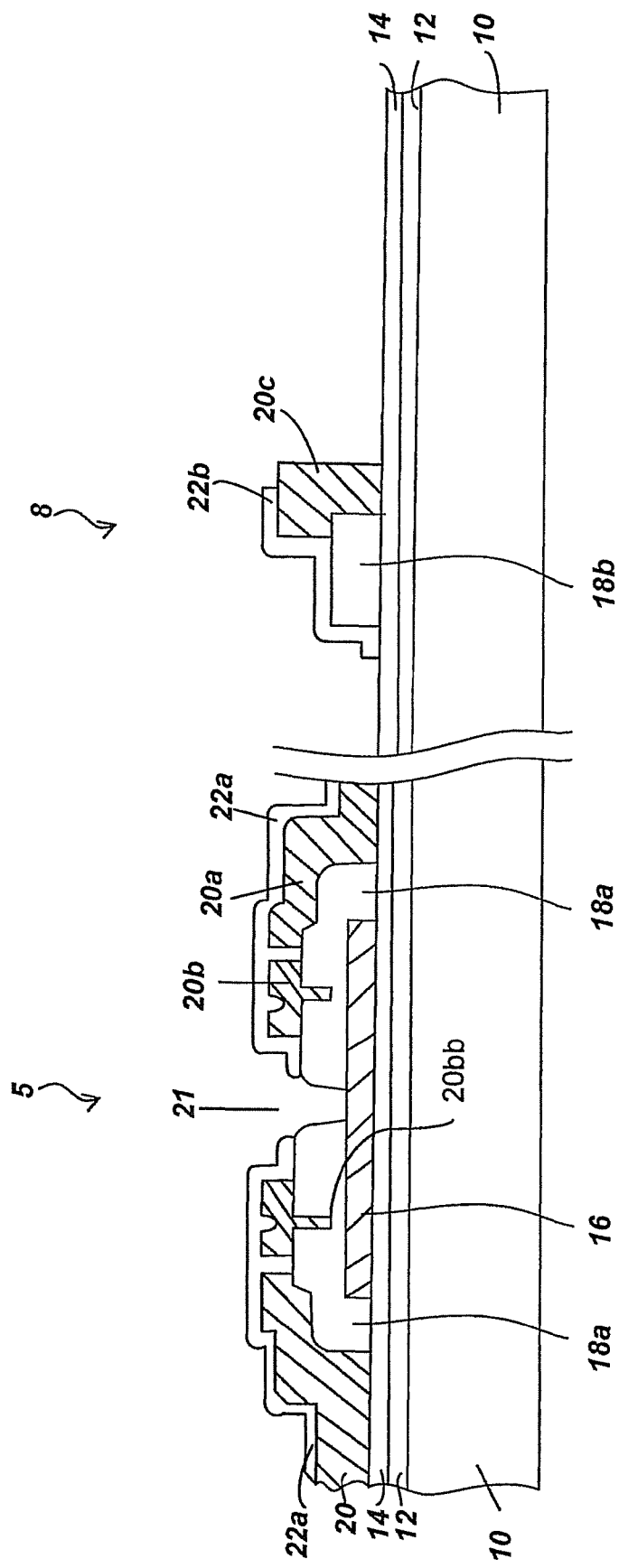

Referring to FIG. 2C, portions 22*a* and 22*b* of a second sacrificial layer are formed in the semiconductor structure area 5 and the semiconductor monitor structure area 8, respectively. The second sacrificial layer portions 22*a* and 22*b* cover the first structural layer portions 20*a* and 20*b*, exposing the polysilicon plate 16 in the opening 21. The second sacrificial layer portion 22*b* partially covers the first sacrificial layer portion 18*b* and the first structural layer portion 20*c*. The portion 22*b* of the second structural layer in the semiconductor monitor structure area 8 becomes another element of the semiconductor monitor structure. The second sacrificial layer portions 22*a* and 22*b* can be a material such as silicon oxide, silicon nitride, silicon oxy-nitride or the other material which has a removal rate with respect to an etch process different from that of the first structural layer portions 20*a*, 20*b* and 20*c*. In some embodiments, the second sacrificial layer portions 22*a* and 22*b* are oxide and can be formed, for example, by CVD. The pattern of the second sacrificial layer portions 22*a* and 22*b* can be formed, for example, by forming a second sacrificial material over the structure in FIG. 2B. A photolithographic process and an etch process then pattern the second sacrificial material so as to form the second sacrificial layer portions 22*a* and 22*b*. In some embodiments, the first sacrificial layer portions 18*a* and 18*b* have a material similar to that of the second sacrificial layer portions 22*a* and 22*b*. With similar material properties, the first sacrificial layer portion 18*a* and the second sacrificial layer portion 22*a* can be removed in one etch process. One of ordinary skill in the art, after viewing the descriptions of this embodiment, will understand that the selection of the material for the first sacrificial layer 18*a* and the second sacrificial layer 22*a* takes into consideration the process for fabricating the semiconductor structure.

In some embodiments, the second sacrificial layer portions 22*a* and 22*b* are formed by different processes which form and pattern different structural materials. One of ordinary skill in the art will understand that forming the second sacrificial layer portions 22*a* and 22*b* in the same process can simplify the manufacturing of the MEMS device.

Figure 2D:
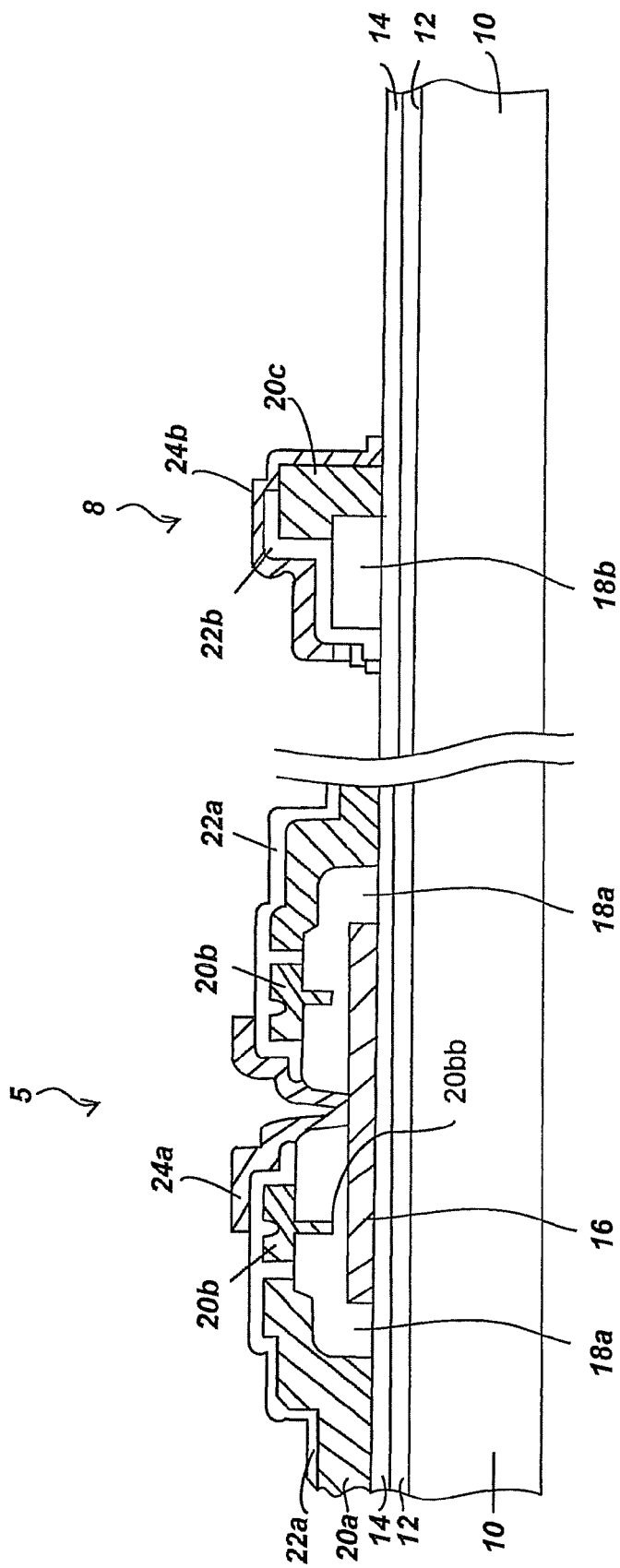
Figure 2E:
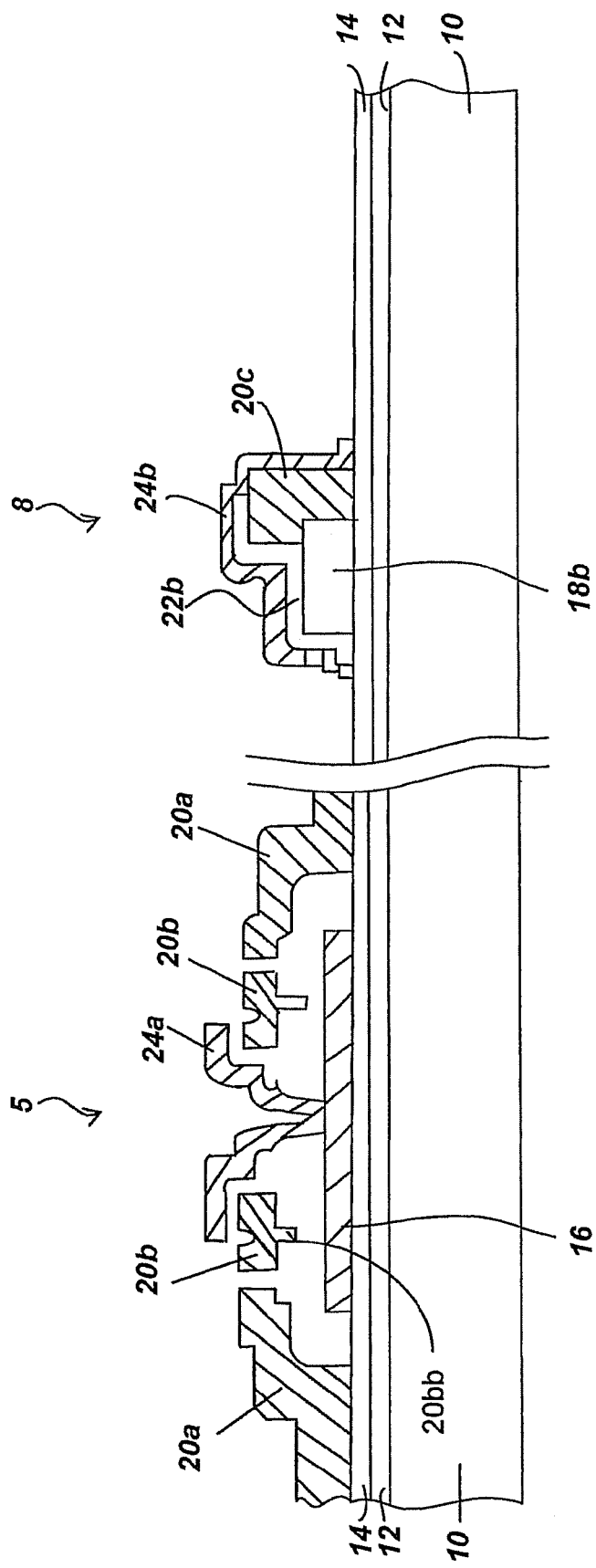

Referring to FIG. 2D, second structural layer portions 24*a* and 24*b* are formed in semiconductor structure area 5 and the semiconductor monitor structure area 8. The second structural layer 24*a* is formed in the opening 21, serving as a central bearing. The second structural layer 24*b* covers the first sacrificial layer 18*b*, the first structural layer 20*c* and the second sacrificial layer 22*b*. The second structural layer portions 24*a* and 24*b* can be a material such as silicon and can be formed, for example, by CVD. In this embodiment, the second structural layer portions 24*a* and 24*b* are doped polysilicon. The pattern of the second structural layer portions 24*a* and 24*b* can be formed, for example, by forming a second structural material (not shown) over the structure in FIG. 2C. A photolithographic process and an etch process pattern the second structural material so as to form the second structural layer portions 24*a* and 24*b*. In this embodiment, the second structural layer 24*b* covers the first sacrificial layer 18*b*, the first structural layer 20*c* and the second sacrificial layer 22*b*. In some embodiments, structure 24*b* may be part of an additional sacrificial layer covering the first sacrificial layer 18*b*, the first structural layer 20*c* and the second sacrificial layer 22*b*, as long as the structure 24*b* is not removed in the subsequent relieving process that removes sacrificial layer portions 18*a* and 22*a*.

Referring to FIG. 2E, a relieving process removes the first sacrificial layer 18*a* and the second sacrificial layer 22*a*. The relieving process may comprise, for example, a dry etch process or a wet etch process. In this embodiment, both of the first sacrificial layer 18*a* and the second sacrificial layer 22*a* are oxide. The relieving process may comprise a wet etch process with a solution such as diluted HF, buffered HF or the other solution that is adapted to remove oxide. In this embodiment, the wet etch process has a higher etch rate for the sacrificial layer than the etch rate for the structural layer.

In some embodiments, the material of the first sacrificial layer 18*a* is different from that of the second sacrificial layer 22*a*. Then a two-step etch process may be required. The first etch step removes the first sacrificial layer 18*a* and the second etch step removes the second sacrificial layer 22*a*. However, if the materials of the first sacrificial layer 18*a* and the second sacrificial layer 22*a* are such that one-step etch process can remove the first sacrificial layer 18*a* and the second sacrificial layer 22*a* without difficulty, the two-step etch process is not necessarily required. After reading the descriptions of this embodiment, one of ordinary skill in the art will understand how to select the etch process and how to arrange the etch steps for the sacrificial layer portions.

In the semiconductor structure area 5, the rotor, i.e. the first structural layer 20*b*, is free floating, and retained within its operational cavity by the second structural layer 25*a* which securely anchors to the polysilicon plate 16. In the semiconductor monitor structure area 8, the semiconductor monitor structure comprises the first sacrificial layer 18*b*, the first structural layer 20*c* and the second sacrificial layer 22*b*. Due to the covering of the second structural layer 24*b*, the relieving process does not remove the sacrificial layer portions 18*b* and 22*b* or structural layer portions 20*c* and 24*b*. The concern regarding the lift-off of the sacrificial layer portions 18*b* and 22*b* or structural layer portions 20*c* and 24*b* which results in particles on the wafer can be eliminated.

Referring to FIG. 2E, the first sacrificial layer 18*b*, the first structural layer 20*c* and the second sacrificial layer 22*b* anchor to the base layer 14. In some embodiments, it is not necessarily required that the first sacrificial layer 18*b*, the first structural layer 20*c* and the second sacrificial layer 22*b* anchor to the base layer 14, because the second structural layer 24*b* covers the semiconductor monitor structure. Accordingly, the design of the semiconductor monitor structure can be more flexible without a risk that the unanchored layers will lift off causing the particle issue.

In this embodiment, the structural layer 24*b* is used to cover the semiconductor monitor structure. In some embodiments, an additional sacrificial layer (not shown) can be used to prevent the semiconductor monitor structure 18*b*, 20*c*, 22*b* from being relieved as long as the additional sacrificial layer is not substantially removed while the relieving process removes the sacrificial layer portions 18*a* and 22*a*.

Figure 2F:
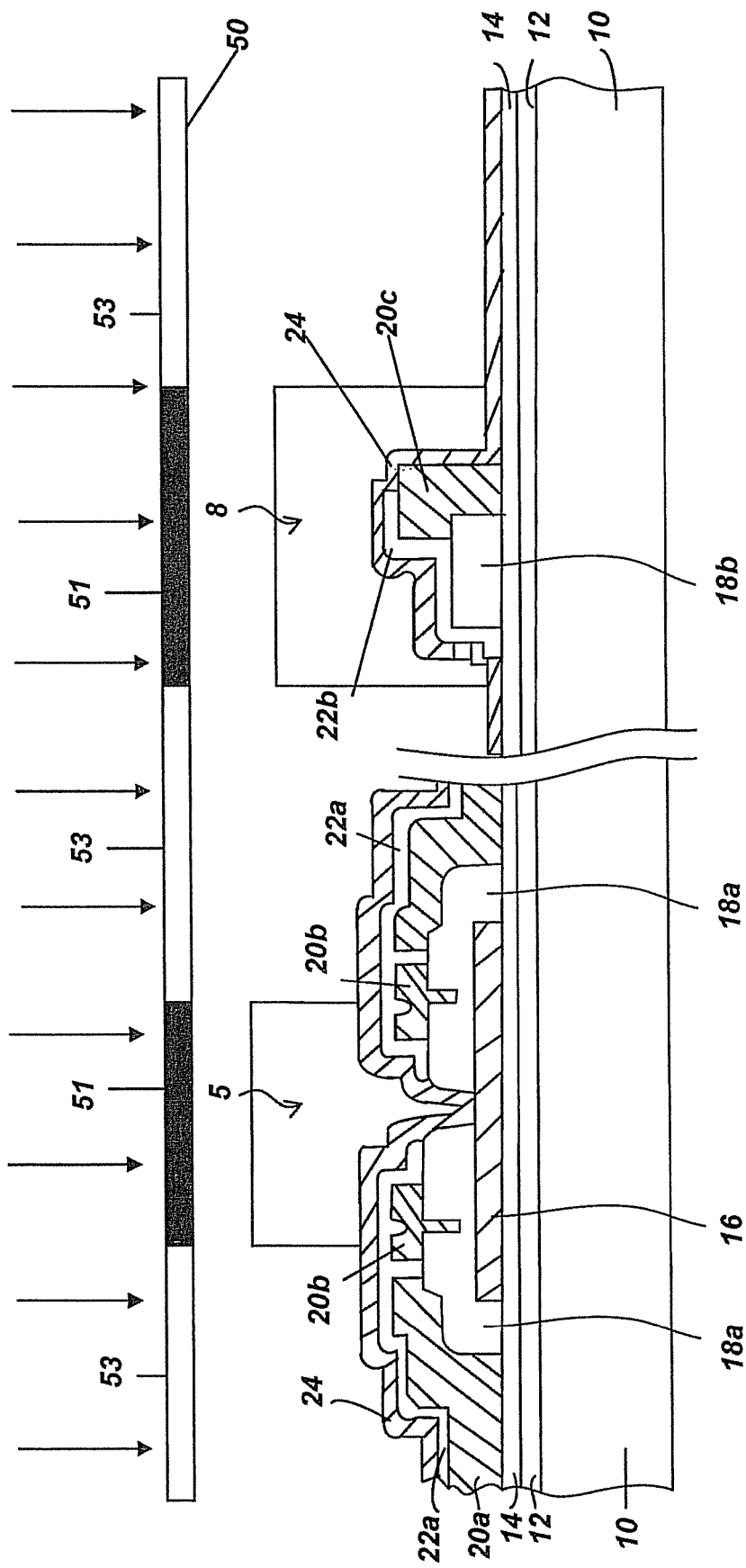

FIG. 2F is a schematic drawing showing an exemplary photolithographic process by for forming the structure shown in FIG. 2D by using a mask. According to the descriptions above, a mask 50 for a photolithographic process is required to prevent a photoresist layer 60 which covers the semiconductor monitor structure on the semiconductor monitor structure area 8 from being exposed. The mask 50 comprises clear areas 53 and dark areas 51. The clear areas 53 subject a photoresist material (not shown) to the exposure process and the photoresist material under the clear areas 53 is removed. The dark areas 51 prevent the photoresist material from being exposed so as to form the photoresist layers 60 which cover the semiconductor monitor structure and the area where a central bearing 24a is going to be formed. Then the photoresist layers 60 serves as an etch mask for removing portions of the second structural layer 24. After the removing process, the photoresist layers 60 are removed and a structure shown in FIG. 2D is thus formed. Accordingly, the second structural layer portion 24b shown in FIG. 2D covers the semiconductor monitor structure so as to prevent the lift-off of the semiconductor monitor structure from the substrate 10 while the sacrificial layer portions 18a and 22a of the semiconductor structure are removed. The mask 50 can be, for example, a mask for forming a sacrificial layer pattern or a structural layer pattern. One of ordinary skill in the art, after reading the descriptions of this embodiment, will understand how to design the mask on the sacrificial layer mask or the structural layer mask.

Although the present invention has been described in terms of exemplary embodiment, it is not limited thereto. Rather, the appended claims should be constructed broadly to include other variants and embodiments of the invention which may be made by those skilled in the field of this art without departing from the scope and range of equivalents of the invention.

What is claimed is:

1. A structure, comprising:
   a monitor structure formed over a monitor region of a substrate, the monitor structure having a first sacrificial layer and a structural layer contacting each other and having bottom surfaces coplanar with each other in the monitor region; and
   a material layer covering the first sacrificial layer and the structural layer so as to prevent removal of the first sacrificial layer from the substrate while a second sacrificial layer is removed from a micro electromechanical system (MEMS) region of the substrate to form a MEMS, the MEMS comprising portions of the structural layer and the material layer in the MEMS region, the monitor region being entirely offset from the MEMS region in a direction parallel to a planar top surface of the substrate.

2. The structure of claim 1, wherein the first sacrificial layer does not anchor to the substrate.

3. The structure of claim 1, wherein the material layer comprises a third sacrificial layer or an additional structural layer.

4. The structure of claim 1, wherein the first sacrificial layer in response to a wet etch process has a removal rate higher than that of the structural layer in response to the wet etch process.

5. The structure of claim 1, wherein the second sacrificial layer covers the first sacrificial layer and partially covers the structural layer, wherein the material layer covers the second sacrificial layer and a remaining part of the structural layer not covered by the second sacrificial layer.

6. The structure of claim 5, wherein the second sacrificial layer and the material layer directly contact the substrate in the monitor region.

7. A structure, comprising:
   a micro electromechanical device formed over a substrate, the micro electromechanical device comprising a first portion of a material layer and a first portion of a structural layer; and
   a monitor structure formed over the substrate, the monitor structure having a first sacrificial layer and a second portion of the structural layer contacting each other and having bottom surfaces coplanar with each other, wherein the micro electromechanical device is separated from the monitor structure in a direction parallel to a top surface of the substrate, and a second portion of the material layer covers the monitor structure.

8. The structure of claim 7, wherein the first sacrificial layer does not anchor to the substrate.

9. The structure of claim 7, wherein the material layer comprises a third sacrificial layer or an additional structural layer.

10. The structure of claim 7, wherein the first sacrificial layer in response to a wet etch process has a removal rate higher than that of the structural layer in response to the wet etch process.

11. The structure of claim 8, wherein:
    the first portion of the structural layer is a rotatable rotor; and
    the first portion of the material layer is a central bearing that retains the rotor.

12. A structure, comprising:
    a micro electromechanical device formed over a substrate, the micro electromechanical device comprising a first portion of a structural layer and a first portion of a material layer in at least one opening which is formed by removing a first portion of a first sacrificial layer; and
    a monitor structure formed over the substrate, the monitor structure having a second portion of the first sacrificial layer and a second portion of the structural layer contacting each other and having bottom surfaces coplanar with each other, wherein the micro electromechanical device is separated from the monitor structure in a direction parallel to a top surface of the substrate, and a second portion of the material layer covers the monitor structure.

13. The structure of claim 12, wherein the first sacrificial layer does not anchor to the substrate.

14. The structure of claim 12, wherein the material layer comprises a third sacrificial layer or an additional structural layer.

15. The structure of claim 12, wherein the first sacrificial layer comprises silicon oxide, silicon oxy-nitride or silicon nitride, and the structural layer comprises silicon.

16. The structure of claim 12, wherein the first sacrificial layer in response to a wet etch process has a removal rate higher than that of the structural layer in response to the wet etch process.

17. The structure of claim 13, wherein:
    the first portion of the structural layer is a rotatable rotor; and
    the first portion of the material layer is a central bearing that retains the rotor.

18. The structure of claim 17, wherein the at least one opening includes a space adjacent to the rotor, the space adjacent to the rotor formed by removing a first portion of a second sacrificial layer, and the monitor structure includes a second portion of the second sacrificial layer above the second portion of the first sacrificial layer and the second portion of the structural layer.

19. The structure of claim 18, wherein the second portion of the second sacrificial layer partially covers the second portion of the structural layer, and the second portion of the material layer covers the second portion of the second sacrificial layer and a remaining part of the second portion of the structural layer not covered by the second portion of the second sacrificial layer.

20. The structure of claim 19, wherein the second portion of the second sacrificial layer and the second portion of the material layer directly contact the substrate.

* * * * *